(12) United States Patent
Sakakibara et al.

(10) Patent No.: US 6,573,322 B1
(45) Date of Patent: Jun. 3, 2003

(54) ELECTROCONDUCTIVE RESIN COMPOSITION

(75) Inventors: Kazutoshi Sakakibara, Aichi-gun (JP); Takashi Nakashima, Aichi-gun (JP); Minoru Kaneko, Aichi-gun (JP); Masatoshi Harada, Aichi-gun (JP)

(73) Assignee: Togo Seisakusho Corporation, Aichi-ken (JP)

( * ) Notice: Subject to any disclaimer, the term of this patent is extended or adjusted under 35 U.S.C. 154(b) by 0 days.

(21) Appl. No.: 09/265,836

(22) Filed: Mar. 10, 1999

(30) Foreign Application Priority Data

Mar. 10, 1998 (JP) .......................................... 10-058453

(51) Int. Cl.$^7$ ................................................ C08K 3/10
(52) U.S. Cl. ........................ 524/434; 524/435; 524/437; 524/439
(58) Field of Search ................................ 524/434, 435, 524/437, 439

(56) References Cited

U.S. PATENT DOCUMENTS 4,748,193 A * 5/1988 Hays, Jr. ..................... 524/439
4,776,979 A * 10/1988 Kageyama ................... 524/439
5,250,585 A * 10/1993 Guggenberger et al. .... 524/439

FOREIGN PATENT DOCUMENTS

| JP | 58-206638 | 12/1983 |
| JP | 58-206641 | 12/1983 |
| JP | 60-083817 | 5/1985 |
| JP | 03-133808 | 6/1991 |
| JP | 5-325637 | 12/1993 |
| JP | 7-49491 | 5/1995 |
| WO | 96 30966 | 10/1996 |

* cited by examiner

*Primary Examiner*—Peter D. Mulcahy
(74) *Attorney, Agent, or Firm*—Jacobson Holman PLLC

(57) ABSTRACT

An electroconductive resin composition which exhibits excellent moldability and electric conductivity, and is produced at low costs. The electroconductive resin composition contains a zinc-based metal powder, low melting metal which melts upon molding, and thermoplastic resin. The zinc-based metal powder having a large surface area captures the molten low melting metal to prevent the phase separation thereof from both the resin and zinc-based metal powder. The zinc-based metal powder has a round configuration, as compared to that of fiber so as not to damage the fluidity of the resin greatly. Thus, the resultant electroconductive resin composition is excellent in moldability, and can be produced at low costs.

14 Claims, 4 Drawing Sheets

ELECTROCONDUCTIVE RESIN COMPOSITION

BACKGROUND OF THE INVENTION

1. Field of the Invention

The present invention relates to an electroconductive resin composition as a resin composition for use in electric wiring.

2. Description of the Related Art

Examples of an electroconductive resin composition which contains a low melting metal melting at an injection molding temperature are disclosed in Japanese Patent Publication No. Hei 7-49491 and Japanese Patent Application laid-open No. Hei 5-325637. These electroconductive resin compositions are respectively composed of a metal fiber, low melting metal and synthetic resin, and generally formed by injection molding or like method into predetermined configurations. The metal fiber and low melting metal as components are embedded in the synthetic resin in close contact with each other. Thus, resultant molded bodies exhibit electric conductivity.

The conventional electroconductive resin compositions, however, have problems of low fluidity and bad moldability, because the metal fiber has been used as a main component adapted to give electric conductivity. To improve the moldability, the metal fiber content may be reduced while increasing the low melting metal content. But, with this method, there arises another problem that phase separation of the low melting metal occurs upon molding to disenable the formation of the molded bodies which exhibit homogeneous electric conductivity. In addition, there also arises the problem that the metal fiber is too expensive to be used industrially.

SUMMARY OF THE INVENTION

It is an object of the present invention to provide an electroconductive resin composition which is excellent in both moldability and electric conductivity, and is produced at low costs.

The present inventors have noted that a metal fiber used conventionally as an electroconductive material degrades the moldability, and contemplated the use of a metal powder in place of the metal fiber. And they have found that the combination of a zinc metal powder and solder alloy containing tin as a main component exhibits excellent moldability and phase-separation resistance, and have completed the present invention. Namely, the present invention is characterized in that the electroconductive resin composition contains a zinc-based metal powder, low melting metal which melts upon molding, and synthetic resin material.

It can be considered that the zinc-based metal powder which has a large surface area captures the molten low melting metal to obstruct the phase separation of the low melting metal from both resin and zinc-based metal powder. Furthermore, the zinc-based metal powder has a round configuration so as not to damage the fluidity of the resin greatly. Thus, the electroconductive resin composition of the present invention exhibits excellent moldability.

As described above, the electroconductive resin composition of the present invention contains the zinc-based metal powder, low melting metal and synthetic resin material.

The zinc-based metal powder is a main component exhibiting electric conductivity. Examples of the zinc-based metal powder include a metal zinc powder, brass powder and tin-zinc powder. Examples of the configuration of each powder include spherical, elliptical, and flaky configurations. It is preferable that the surface of each powder is provided with a large number of irregularities to obtain an increased specific surface area. With the increased specific surface area, the molten low melting metal can be captured firmly, and consequently, the phase separation of the molten low melting metal can be prevented effectively. Zinc is wetted well with the low melting metal, particularly tin, and also is not alloyed with tin at a high rate. Consequently, tin wetted with and adhering to the surface of zinc is only slightly alloyed with zinc to be absorbed therewith so that such tin exists on the surface of zinc for a long time as molten tin or a tin alloy, which is favorable for joining the zinc-based metal powder.

The preferred particle diameter of the zinc-based metal powder is about 1 to 100 $\mu$m, and more preferably about 15 to 80 $\mu$m. As the particle diameter decreases, oxidation film increases to worsen the current-carrying properties, whereas as the particle diameter increases, the dispersing properties thereof lowers, and consequently, both the moldability and strength decrease.

The preferred zinc-based metal powder content is about 10 to 60 volume % per 100 volume % of the overall electroconductive resin composition. If good electric conductivity is required, the preferred content is 30 volume % or more, and more preferably 40 volume % or more. If molded products are required to have increased strength, the preferred zinc-based metal powder content is 40 volume % or less.

To strengthen joining of the zinc-based metal powder and resin, it is also preferable to treat the surface of the zinc-based metal powder with a silane-based or titane-based coupling agent.

Tin alloys normally known as solder can be used as the low melting metal. More specifically, tin, tin-zinc, tin-copper, tin-indium, tin-silver alloys or the like can be used. Normally, the low melting metal is added to the resin as a fine powder. The preferred particle diameter of the low melting metal is about 6 to 50 $\mu$m.

The low melting metal content is about 3 to 30 volume %, and more preferably 6 to 15 volume %, per 100 volume % of the overall electroconductive resin composition.

Thermoplastic resins can be used as the synthetic resin material. More specifically, crystalline resin such as 12-nylon, 6-nylon, 66-nylon, polyacetals, polyethylene terephthalate(PET), polybutylene terephthalate(PBT), polyphenylene sulfide(PPS), polystyrene, syndiotactic polystyrene(SPS), polypropylene(PP), polyethylene(PE) and ethylene copolymerized resin (EVA, EAA, ionomer), non-crystalline resins such as ABS, polyurethane, polycarbonate(PC), and renatured polyphenylene oxide resin, liquid crystal polymer, and thermoplastic elastomer can be used. In addition, polymer alloys formed by blending at least one of these thermoplastic resins together may be used. In special cases, a rubber material such as silicon rubber, fluorine rubber, acrylic rubber and the like, epoxy resin, pherolic plastic and thermosetting resin can be used.

The preferred synthetic resin material content is about 30 to 80 volume %, and more preferably 40 to 65 volume %, per 100 volume % of the overall electroconductive resin composition.

The preferred relative composition ratio of the zinc-based metal powder to low melting metal is about 1 to 20 in volume, and more preferably about 4 to 10 in volume. If the relative composition ratio decreases, low melting metals readily cohere to each other to worsen the moldability. If the relative composition ratio increases, the electric conductivity and electromagnetic shielding tend to decrease.

In addition, a metal fiber, metal powder other than the zinc-based metal powder, filler such as calcium carbonate or talc, and other additives normally used in preparing resin compositions can be added.

The preferred metal fiber is an aluminum-based metal fiber composed of aluminum, an aluminum alloy or the like. The preferred diameter of the metal fiber is about 50 to 100 μm, and the preferred length thereof is about 2 to 5 mm to effect good moldability and electric conductivity. Where the aluminum-based metal fiber is used as the metal fiber, the preferred content of the zinc powder and aluminum-based metal fiber is about 20 to 50 volume % per 100 volume % of the overall electroconductive resin composition.

The preferred volume ratio of the total of the zinc powder and aluminum-based metal fiber to the low melting metal, that is, (volume of zinc powder+volume of aluminum-based metal fiber)/volume of the low melting metal, ranges from 2 to 17. When this ratio increases further, the electric conductivity becomes worse, whereas when this ratio decreases further, the separation of the low melting metal occurs.

The electroconductive resin composition can be produced by melting and kneading the above-described components with an extruder or the like into pellets. By injection molding of the resultant electroconductive resin composition as a raw material, a resin molded product exhibiting a desired electric conductivity can be obtained. In particular, the electroconductive resin composition of the present invention is favorable as a material for use in electric circuits. Excellent resin-molded electric parts can be obtained by molding a substrate with a non-electroconductive resin composition, and molding an electric circuit with the electroconductive resin composition of the present invention on the substrate integrally therewith by two-step molding.

In the cases only the electric circuit is formed using the electroconductive resin by two-step molding, it is also preferable to increase the content of metal components such as the zinc-based metal powder and low melting metal, and consequently, enhance the electric conductivity of the resultant electric circuit further.

If resultant molded parts are required to effect electromagnetic shielding or exhibit thermal conductivity, the synthetic resin material content can be increased while decreasing the metal components content to obtain necessary strength. To mold gaskets having electromagnetic shielding properties, rubber or elastomer can be used as the synthetic resin material.

With the electroconductive resin composition of the present invention, the zinc-based metal powder acts as a main component of an electroconductive material thereof. The zinc-based metal is relatively soft as a metal material, and the melting point thereof is low. In addition, the zinc-based metal powder is well wetted with an tin alloy as a low melting metal. This results in the molten low melting metal adhering to the surface of the zinc-based metal powder to be captured therewith so that the phase separation of the molten low melting metal from both the resin and zinc-based metal powder is reduced. The zinc-based metal powder does not have a fiber-like configuration, but has a relatively round configuration, as compared to the fiber so as not to obstruct the flow of the molten resin greatly. Thus, the electroconductive resin composition of the present invention has good moldability.

It is expected that if the metal fiber is replaced with the metal powder, the electric conductivity of resultant molded bodies would be degraded thereby. But, actually, the electric conductivity thereof is not degraded greatly, which does not cause any practically great problem. To overcome the degradation of the moldability, which has been encountered with the case a large amount of metal fiber is contained, the amount of the resin component need be increased. In contrast, with the use of the zinc-based metal powder, the moldability is enhanced so that the composition ratio of the zinc-based metal powder can be increased while reducing the composition ratio of the resin component. This results in the degradation of the electric conductivity due to the use of the zinc-based metal powder being able to be covered.

The electroconductive resin composition in accordance with the present invention can be applied to electric circuits by two-step molding, resin molded products having electromagnetic shielding function, gaskets for use in electromagnetic shielding, or the like.

Other objects, features, and characteristics of the present invention will become apparent upon consideration of the following description and the appended claims with reference to the accompanying drawings, all of which form a part of this specification.

DETAILED DESCRIPTION OF THE PRESENTLY PREFERRED EXEMPLARY EMBODIMENTS

Embodiment 1

Eight kinds of electroconductive resin compositions shown in TABLE 1 were prepared. Raw materials used include nonleaded solder (Sn—Cu—Ni, melting point: 225° C.) having an average particle diameter of 50 μm as the low melting metal, metal zinc powder having a median particle diameter of 286 μm (liquid drop), 65 μm (ball), 22 μm (flake) as the zinc-based metal powder, copper fiber (diameter: 30 μm, length: 2.5 mm) and aluminum fiber (diameter: 90 μm, length: 3 mm) as the metal fiber, ABS, PBT, polyphenylene sulfide (PPS), 12-nylon, renatured polyphenylene oxide (renatured PPE), and thermoplastic elastomer (TPE) as the resin.

These raw materials were mixed together in the composition ratio shown in TABLE 1, and extruded into a rod-like configuration with an extruder. Then, resultant rod-like members were respectively cut to obtain pellets, each having a diameter of 5 mm and a length of 5 mm.

Figure 1:
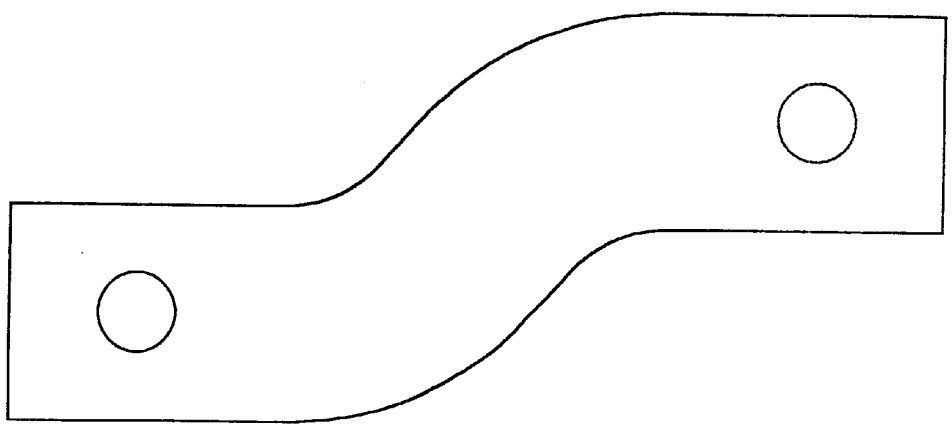
FIG. 1 is a plan view of a molded product used in experiments of electroconductive materials.

Next, current-carrying plate members were molded with an injection molding machine under normal injection molding conditions. As shown in FIG. 1, each current-carrying plate member has a curved configuration like a letter S, and has dimensions of 2 mm in thickness, 15 mm in width, and 74 mm in length. Two holes, each having a diameter of 6 mm, are formed through the electroconductive plate member at distance 10 mm inwardly from both ends thereof about the widthwise center thereof.

There was no problem in moldability of resultant samples except for the sample No. 8.

The electric conductivity of each sample was obtained by securing terminals, each having a diameter of 12 mm, to the two holes in the current-carrying plate member with screws, respectively, and measuring the electric resistance across the terminals with a milliohm high tester. The measurement results are also shown in TABLE 1.

Furthermore, the temperature of the surface of each current-carrying plate member when a direct current of 20 A was applied across the terminals for 30 minutes was measured. The measurement was performed at room temperature of 22° C. The measurement results are also shown in TABLE 1.

only the copper fiber but did not contain any low melting metal, showed high volume resistivities. Particularly, the molded product of the sample No. 8 was short in current-carrying property due to the temperature rise so as not to be suitable for the current-carrying material. In addition, there was also the problem in moldability.

Embodiment 2

Three kinds of electroconductive resin compositions as shown in TABLE 2 were prepared. Raw materials used include a low melting metal composed of Sn—Cu—Ni solder (melting point: 225° C.) having a ball-like configuration and an average particle diameter of 50 $\mu$m, and Sn solder (melting point: 232° C.) having a ball-like configuration and an average particle diameter of 40 $\mu$m, a zinc-based metal powder composed of two kinds of metal zinc powders, one having a ball-like configuration and a median particle diameter of 3 $\mu$m and another having a ball-like configuration and a median particle diameter of 70 $\mu$m, and resin composed of a polymer alloy of polyphenylene oxide (PPO) and polypropylene (PP), and syndiotatic polystyrene (SPS).

| Electric conductivity giving material sample | Composition Median diameter | Configuration | Sample NO 1 | 2 | 3 | 4 | 5 | 6 | 7 | 8 |
|---|---|---|---|---|---|---|---|---|---|---|
| Low melting metal | 50 $\mu$m | ball | 6(7) | 10(18) | 10(15) | 10(18) | 10(22) | 18(35) | 0(0) | 0(0) |
| Zinc metal | 286 $\mu$m | liquid drop | 43(76) | 43(70) | 0(0) | 0(0) | 0(0) | 0(0) | 0(0) | 0(0) |
| powder | 65 $\mu$m | ball | 0(0) | 0(0) | 52(76) | 43(70) | 0(0) | 0(0) | 43(80) | 0(0) |
|  | 22 $\mu$m | flake | 0(0) | 0(0) | 0(0) | 0(0) | 19(42) | 0(0) | 0(0) | 0(0) |
| Copper fiber | 30 $\mu$m–2.5 $\mu$m | fiber | 0(0) | 0(0) | 0(0) | 0(0) | 0(0) | 21(50) | 0(0) | 30(80) |
| Aluminum fiber | 90 $\mu$m–3 mm | fiber | 0(0) | 0(0) | 0(0) | 0(0) | 24(20) | 0(0) | 0(0) | 0(0) |
|  | PPS |  | 0(0) | 0(0) | 0(0) | 0(0) | 0(0) | 0(0) | 57(20) | 0(0) |
|  | 12 nylon |  | 0(0) | 0(0) | 0(0) | 0(0) | 0(0) | 61(15) | 0(0) | 70(20) |
|  | Renatured PPE |  | 51(17) | 0(0) | 0(0) | 0(0) | 0(0) | 0(0) | 0(0) | 0(0) |
|  | TPE |  | 0(0) | 47(12) | 0(0) | 0(0) | 0(0) | 0(0) | 0(0) | 0(0) |
|  | Liquid crystal polymer |  | 0(0) | 0(0) | 38(9) | 0(0) | 0(0) | 0(0) | 0(0) | 0(0) |
|  | ABS |  | 0(0) | 0(0) | 0(0) | 47(12) | 0(0) | 0(0) | 0(0) | 0(0) |
|  | PBT |  | 0(0) | 0(0) | 0(0) | 0(0) | 47(16) | 0(0) | 0(0) | 0(0) |
|  | Volume resistivity ($\Omega \cdot$ cm) |  | $1.1 \times 10^{-4}$ | $8.0 \times 10^{-5}$ | $5.8 \times 10^{-5}$ | $9.1 \times 10^{-5}$ | $8.5 \times 10^{-5}$ | $1.5 \times 10^{-4}$ | $6.5 \times 10^{-3}$ | $3.6 \times 10^{-2}$ |
|  | Surface temperature after application of electric current |  | 23 | 23 | 23 | 23 | 23 | 23 | 68 | Short current-carrying |
|  | Moldability |  | good | good | good | good | good | good | good | bad |

As is apparent from TABLE 1, each of molded products composed of the electroconductive resin compositions of the samples Nos. 1 to 5 of the present invention showed a relatively low volume resistivity, generated only a small amount of heat and exhibited good moldability. Each of the electroconductive resin compositions of the samples Nos. 5 and 6 also showed a relatively low volume resistivity, generated only a small amount of heat and exhibited good moldability, but was expensive so as to be less valuable as products, because an expensive copper fiber or aluminum fiber was used.

The molded product of the sample No. 7, which contained only the zinc metal powder but did not contain any low melting metal, and that of the sample No. 8, which contained These raw materials were mixed together in the composition ratio shown in TABLE 2. Resultant mixed materials were respectively extruded into a rod-like configuration with an extruder, and cut to obtain pellets, each having a diameter of 5 mm and a length of 5 mm, similarly to Embodiment 1. Next, current-carrying plate members illustrated in FIG. 1 were molded with an injection molding machine under normal injection molding conditions, similarly to Embodiment 1.

There was no problem in moldability of all of resultant samples. The melt index (MI) and volume resistivity thereof are also shown in TABLE 2. The reason the current-carrying member of the sample No. 12 showed a high volume resistivity has not be clarified.

| Sample NO | | | | 11 | 12 | 13 |
|---|---|---|---|---|---|---|
| Composition | Low melting metal | Cu-Sn base | Median diameter 50 μm ball-like | 6 | 0 | 6 |
| | | Sn | Median diameter 40 μm ball-like | 0 | 6 | 0 |
| | Zinc metal powder | #3 | Median diameter 3 μm ball-like | 45 | 45 | 0 |
| | | #4 | Median diameter 70 μm ball-like | 0 | 0 | 45 |
| | Synthetic resin | PPE/PP | | 49 | 49 | 0 |
| | | SPS | | 0 | 0 | 49 |
| Volume resistivity (Ω · cm) | | | | $9.0 \times 10^{-4}$ | $1.5 \times 10^{1}$ | $7.8 \times 10^{-5}$ |
| Melt index (MI) (ASTM D-1238) 300° C.-10 kg (g/10 min) | | | | 231.5 | 269.2 | 177.0 |

Embodiment 3

A mixed raw material having the composition of 6 volume % of Sn solder (melting point: 232° C.) having a ball-like configuration and an average particle diameter of 40 μm as the low melting metal, 50 volume % of metal zinc powder having a ball-like configuration and a median particle diameter of 70 μm as the zinc-based metal powder, and 44 volume % of a polymer alloy of polyphenylene oxide (PPO) and polypropylene (PP) as the synthetic resin was prepared. Then, pellets and a current-carrying member were formed using the mixed raw material thus prepared, similarly to Embodiment 1.

The volume resistivity of the resultant current-carrying member was $1.5 \times 10^{-4}$ Ω.cm, the coefficient of thermal conductivity thereof was 14.4 W/mk, the tensile strength thereof was 18.9 MPa, the tensile elongation thereof was 6 %, the specific gravity thereof was 4.43, and the flexing point thereof under the load of 0.451 MPa based on ASTM D-648 was 142° C.

Figure 2:
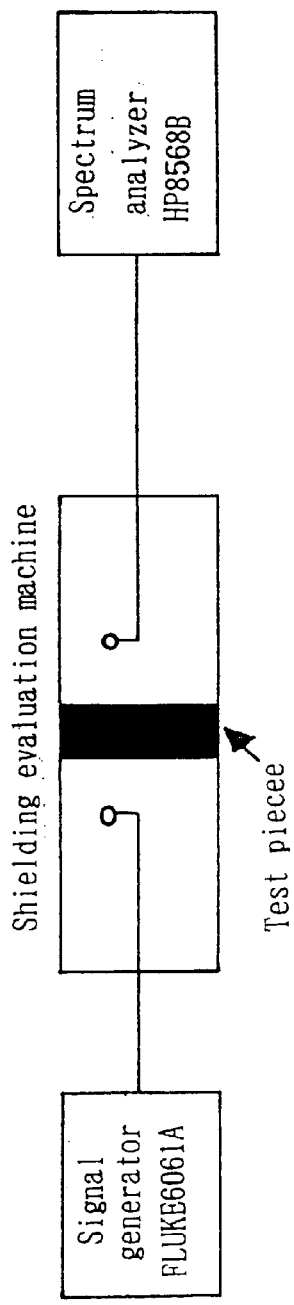
FIG. 2 is a diagram explaining the outline of a shielding evaluation test method of current-carrying members.

Next, the magnetic field-shielding effect and electric field-shielding effect of the current-carrying member were tested with a shielding evaluation machine on the market. The outline of the shielding test method is illustrated in FIG. 2. The current-carrying member of Embodiment 3, a metal (iron) plate having a thickness of 4 mm, and a resin plate having a thickness of 4 mm, to which an electroconductive coating containing silver-copper based metal powder is applied, were tested. The test results are shown in FIGS. 3 and 4.

Figure 3:
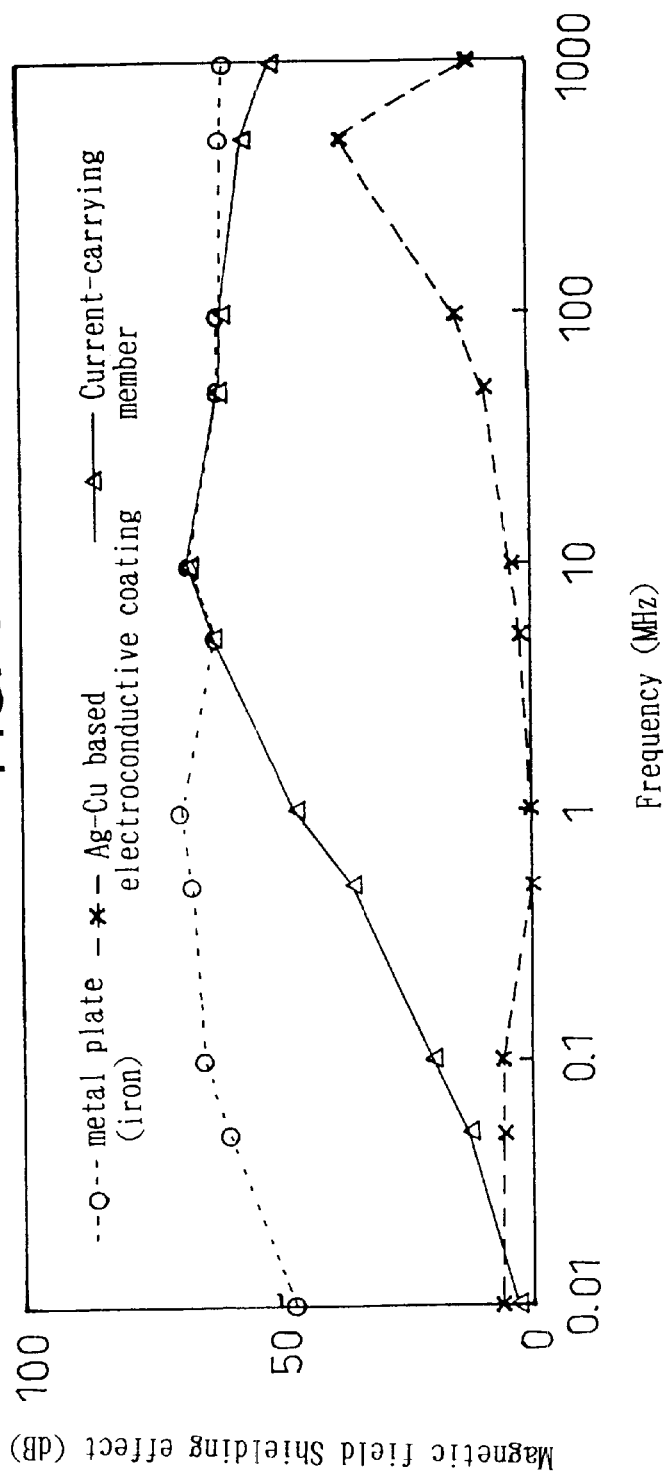
FIG. 3 is a line graph showing the magnetic field-shielding effect of the current-carrying member formed with the composition of Embodiment 3 in accordance with the present invention.
Figure 4:
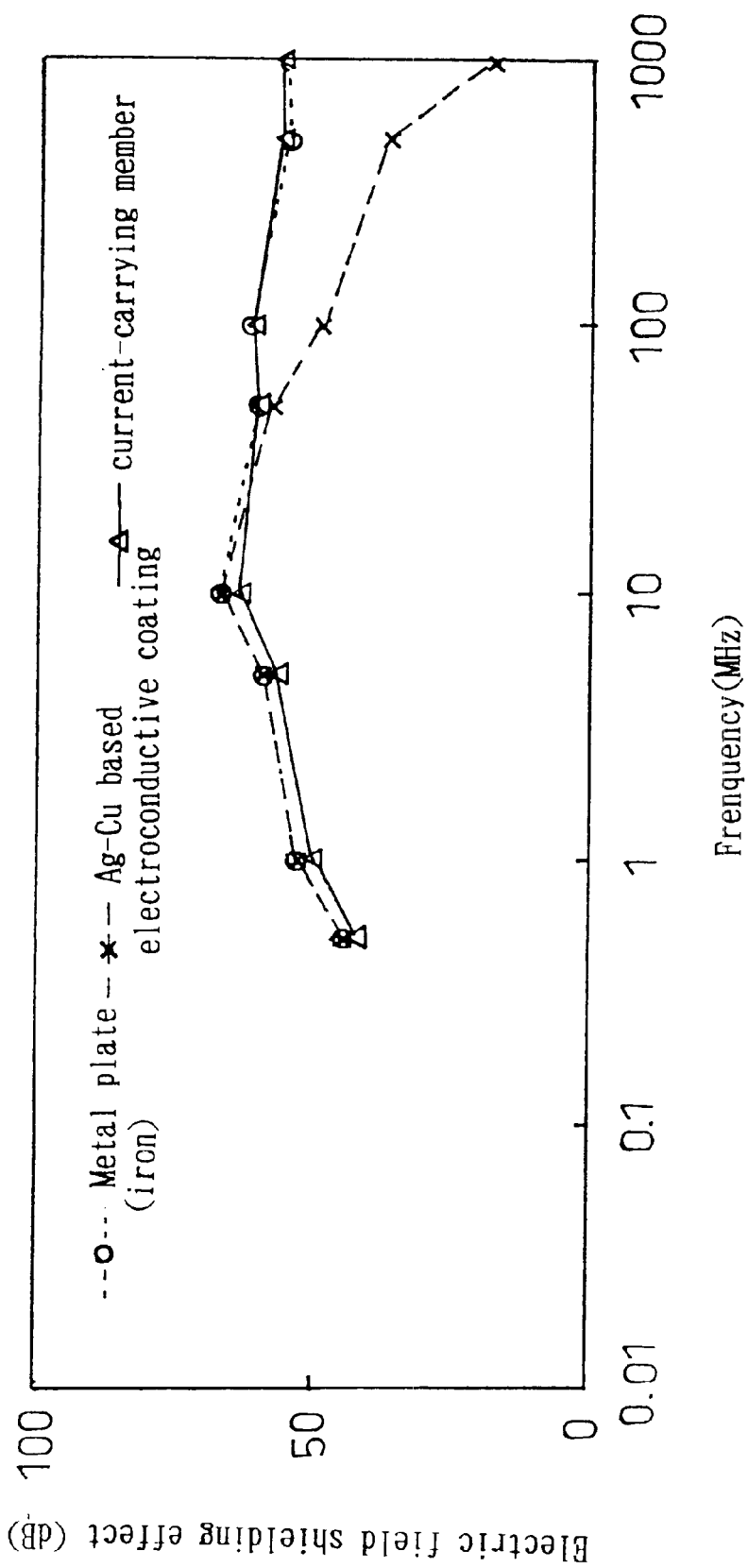
FIG. 4 is a line graph showing the electric field-shielding effect of the current-carrying member formed with the composition of Embodiment 3 in accordance with the present invention.

As is apparent from FIG. 3, the current-carrying member of the present embodiment showed a high shielding effect against magnetic field in the frequency range of 10 to 1000 MHz, which was approximately identical to that of the metal plate. And, as is apparent from FIG. 4, the current-carrying member of the present embodiment also showed a shielding effect against electric field, which was approximately identical to that of the metal plate.

Embodiment 4

Sn solder (melting point: 232° C.) having a ball-like configuration and an average particle diameter of 40 μm was used as the low melting metal, metal zinc powder having a liquid drop-like configuration and a median particle diameter of 18 μm was used as the zinc-based metal powder, aluminum fiber having a diameter of 90 μm and a length of 3 mm was used, and a polymer alloy of polyphenylene oxide (PPO) and polypropylene (PP) was used as the synthetic resin. These materials were mixed together, similarly to Embodiment 1, to obtain twelve kinds of electroconductive resin compositions which have different composition ratios of the metal zinc powder to aluminum fiber: 5 volume % to 25 volume % (symbol ♦ in FIG. 5), 10 volume % to 25 volume % (symbol ■ in FIG. 5), 15 volume % to 20 volume % (symbol ▲ in FIG. 5) and 15 volume % to 25 volume % (symbol ● in FIG. 5) while including 3 volume %, 4 volume % or 5 volume % of Sn solder with the remainder being the above-described synthetic resin.

Next, twelve kinds of plate members, each having dimensions of 120 mm×120 mm×1 mm, were formed by hot pressing, using these twelve kinds of electroconductive resin compositions. Then, the electric resistance across the distance of 120 mm on the surface of each plate member was measured with milliohm high tester (four points type). The measurement results are shown in FIG. 5.

Figure 5:
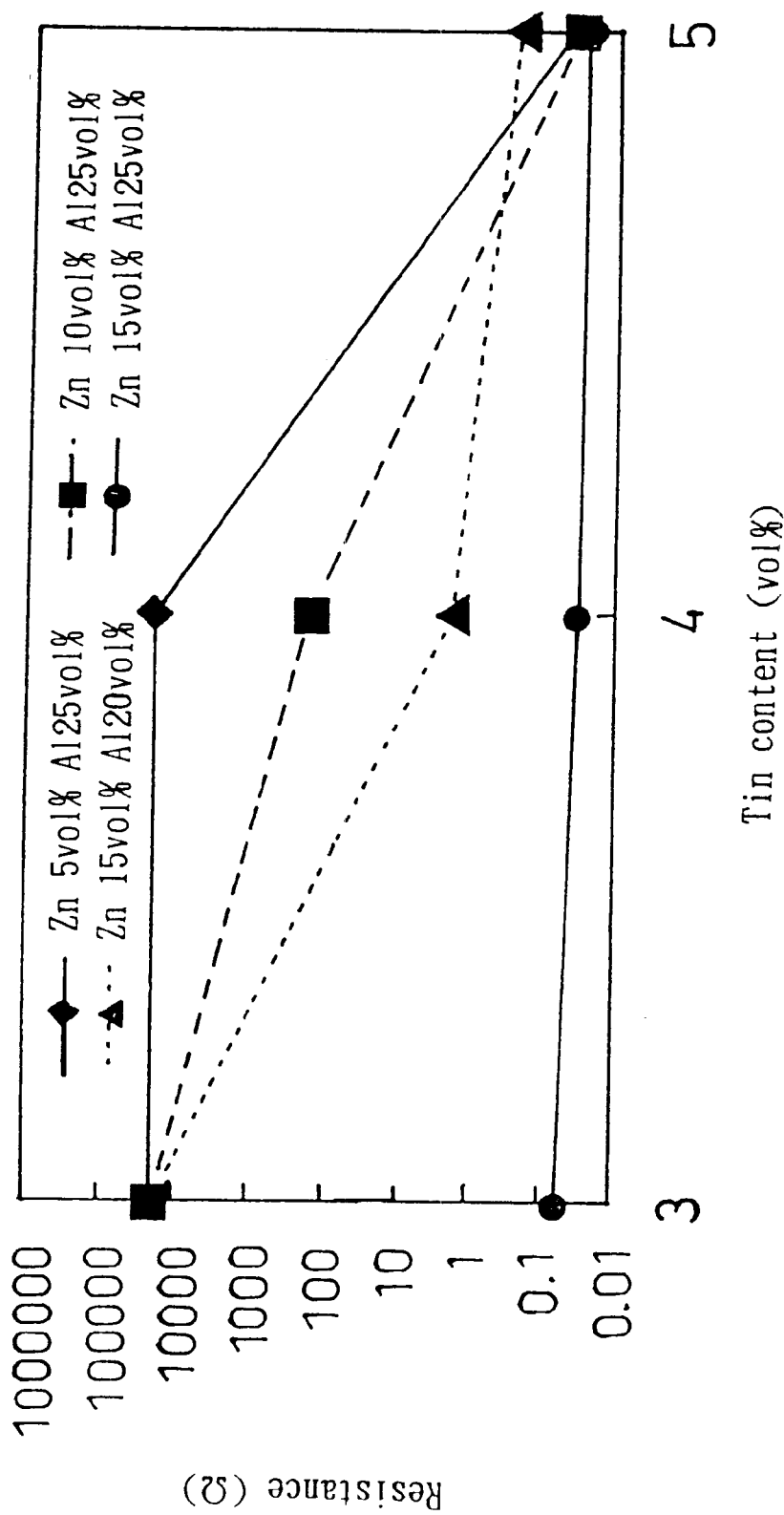
FIG. 5 is a graph showing the relation between the composition ratio of the low melting metal, metal zinc powder and aluminum fiber in the current-carrying members formed with the compositions of Embodiment 4 in accordance with the present invention and the resultant electric resistance.

As is apparent from FIG. 5, in the cases the sum of the zinc metal powder and aluminum fiber is small, the resistance of each plate member greatly varied when the low melting metal content decreased or increased by merely 1 volume %.

As described above, the electroconductive resin composition of the present invention has good moldability and exhibits excellent electric conductivity and thermal conductivity. Furthermore, the electroconductive resin composition of the present invention can be produced at low costs, because inexpensive zinc metal powder is used, and consequently, is of great value as an electroconductive material and thermal-conductive material.

While the invention has been described in connection with what are considered presently to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. An electroconductive resin composition useful as a molded product having conductivity and produced by a process comprising the steps of:

heating a molding composition comprising a synthetic thermoplastic resin, a zinc-based metal powder and a low melting metal to prepare a melting product in which the synthetic thermoplastic resin and the low melting metal are melted, injecting the melting product into a cavity of a die, cooling the die to solidify the melted synthetic thermoplastic resin and the melted low melting metal in which the zinc-based metal powder is dispersed and joined by the melted low melting metal;

wherein said synthetic thermoplastic resin is a resin which melts at a molding temperature, and the content of said synthetic thermoplastic resin is 30 to 80 volume % per 100 volume % of the overall electroconductive resin composition, and said zinc-based metal powder is a metal zinc powder or a zinc alloy powder which does not melt at the molding temperature, and the content of said zinc-based metal powder is 10 to 60 volume % per 100 volume % of the overall electroconductive resin composition, and said low melting metal is tin or a tin alloy which melts at the molding temperature, and the content of said low melting metal is 3 to 30 volume % per 100 volume % of the overall electroconductive resin composition.

2. An electroconductive resin composition as claimed in claim 1, wherein said zinc-based metal powder has a particle diameter of 1 to 100 μm.

3. An electroconductive resin composition as claimed in claim 1, wherein said low melting metal is 15 volume % or less of said electroconductive resin composition.

4. An electroconductive resin composition as claimed in claim 1, wherein said synthetic resin material is at least one of nylon, PBT, liquid crystal polymer, ABS, PPS, thermoplastic elastomer, SPS, PC, PP, PE, ethylene copolymerized resin, polyphenylene resin, silicon rubber, fluorine rubber, acrylic rubber and epoxy resin.

5. An electroconductive resin composition as claimed in claim 1, wherein said zinc-based metal powder is 40 volume % or more of said electroconductive resin composition.

6. An electroconductive resin composition as claimed in claim 1, wherein the total volume of said zinc-based metal powder is 4 to 10 times as large as that of said low melting metal.

7. An electroconductive resin composition as claimed in claim 1, further containing a metal fiber.

8. An electroconductive resin composition as claimed in claim 7, wherein said zinc-based metal powder and said metal fiber are 50 volume % or less of said electroconductive resin composition.

9. An electroconductive resin composition as claimed in claim 7, wherein the total volume of said zinc-based metal powder and said metal fiber is 4 to 10 times as large as that of said low melting metal.

10. An electroconductive resin composition as claimed in claim 7, wherein said metal fiber has a diameter of 50 to 100 μm.

11. An electroconductive resin composition as claimed in claim 7, wherein said metal fiber has a length of 2 to 5 mm.

12. An electroconductive resin composition as claimed in claim 7, wherein said metal fiber is an aluminum-based metal fiber.

13. An electroconductive resin composition useful as a molded product having conductivity, the composition comprising a solidified molded admixture of a metal powder and a liquefied low melting metal in a molten thermoplastic resin;

wherein the thermoplastic resin is a resin which melts at a molding temperature, wherein the metal powder is a zinc metal powder or a zinc alloy powder which does not melt at the molding temperature and;

the low melting metal is tin or a tin alloy which melts at the molding temperature.

14. An electroconductive resin composition of claim 13, essential components of which are the metal powder, the low melting metal and the thermoplastic resin, and wherein the thermoplastic resin comprises 30 to 80 volume percent per 100 volume percent of the electroconductive resin composition, the metal powder comprises from 10 to 60 volume percent per 100 percent of the electroconductive resin composition, and the low melting metal comprises from 3 to 30 volume percent per 100 volume percent of the electroconductive resin composition.

* * * * *